(12) United States Patent
Hsieh

(10) Patent No.: US 10,538,628 B2
(45) Date of Patent: Jan. 21, 2020

(54) VINYLBENZYL IMIDE RESIN, METHOD OF PREPARING VINYLBENZYL IMIDE RESIN, VINYLBENZYL IMIDE PREPOLYMER, RESIN COMPOSITION AND ARTICLE MADE THEREFROM

(71) Applicant: Elite Material Co., Ltd., Taoyuan (TW)

(72) Inventor: Chen-Yu Hsieh, Taoyuan (TW)

(73) Assignee: Elite Material Co., Ltd., Taoyuan (TW)

( * ) Notice: Subject to any disclaimer, the term of this patent is extended or adjusted under 35 U.S.C. 154(b) by 85 days.

(21) Appl. No.: 15/827,936

(22) Filed: Nov. 30, 2017

(65) Prior Publication Data

US 2019/0077914 A1    Mar. 14, 2019

(30) Foreign Application Priority Data

Sep. 14, 2017  (TW) .............................. 106131534 A

(51) Int. Cl.

| | | |
|---|---|---|
| C08G 73/12 | (2006.01) | |
| C08K 3/013 | (2018.01) | |
| C08G 85/00 | (2006.01) | |
| C08L 79/08 | (2006.01) | |
| C08J 5/18 | (2006.01) | |
| C08K 5/00 | (2006.01) | |
| C08F 222/40 | (2006.01) | |
| B32B 15/08 | (2006.01) | |
| C08J 5/24 | (2006.01) | |

(52) U.S. Cl.
CPC .............. *C08G 73/12* (2013.01); *B32B 15/08* (2013.01); *C08F 222/40* (2013.01); *C08G 85/004* (2013.01); *C08J 5/18* (2013.01); *C08J 5/24* (2013.01); *C08K 3/013* (2018.01); *C08K 5/0008* (2013.01); *C08K 5/0025* (2013.01); *C08K 5/0066* (2013.01); *C08L 79/085* (2013.01); *C08F 2222/408* (2013.01); *C08J 2379/08* (2013.01)

(58) Field of Classification Search
CPC ....................................................... C08G 73/12
USPC ................................................. 528/31, 310
See application file for complete search history.

(56) References Cited

PUBLICATIONS

Yasukawa et al; Radical polymerizable imide compounds and manufacture thereof; 1996; Mitsubishi Chemical Corp., JP; Chem Abstract 125: 115425 (Year: 1996).*

* cited by examiner

*Primary Examiner* — Duc Truong
(74) *Attorney, Agent, or Firm* — Muncy, Geissler, Olds & Lowe, P.C.

(57) ABSTRACT

Disclosed is a vinylbenzyl imide resin useful in conjunction with other components to prepare a resin composition for making such as a prepreg, a resin film, a resin film with copper foil, a laminate or a printed circuit board, having improved one or more properties including resin flow, resin filling property, flame retardancy, glass transition temperature, thermal resistance, dielectric constant, dissipation factor and interlayer bonding strength. Also disclosed is a method of preparing the vinylbenzyl imide resin, its prepolymer, a resin composition comprising the vinylbenzyl imide resin and/or its polymer and an article made therefrom.

15 Claims, 1 Drawing Sheet

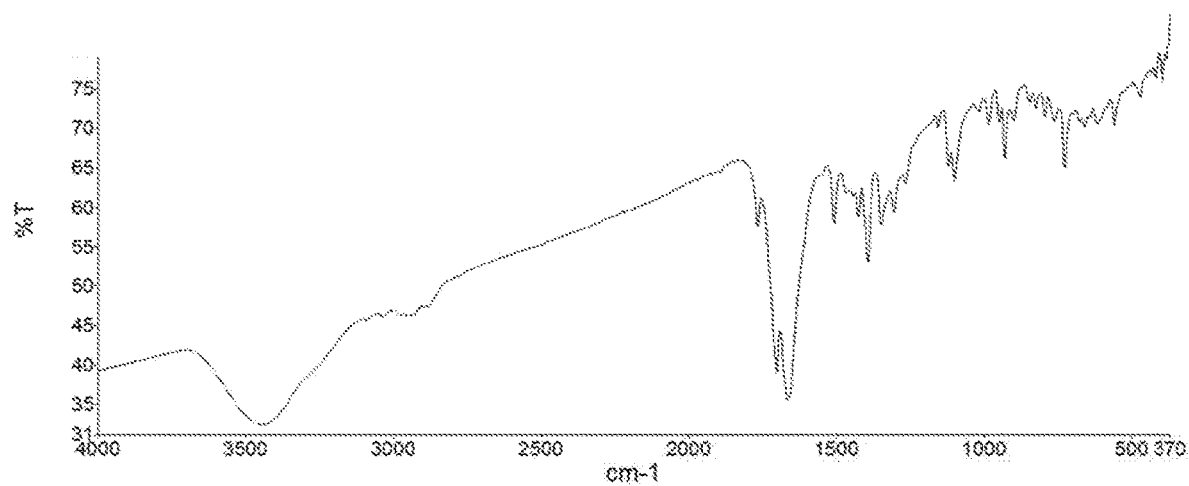

VINYLBENZYL IMIDE RESIN, METHOD OF PREPARING VINYLBENZYL IMIDE RESIN, VINYLBENZYL IMIDE PREPOLYMER, RESIN COMPOSITION AND ARTICLE MADE THEREFROM

CROSS-REFERENCE TO RELATED APPLICATION

This application claims the priority benefits of Taiwan Patent Application No. 106131534, filed on Sep. 14, 2017. The entirety the above-mentioned patent application is hereby incorporated by reference herein and made a part of this specification.

BACKGROUND

1. Field of the Disclosure

The present disclosure relates to a resin material, and more particularly to a vinylbenzyl imide resin, a method of preparing the same, its prepolymer, a resin composition containing the same and an article made therefrom.

2. Description of Related Art

Conventionally, maleimide resin is widely used in a resin composition for making a copper-clad laminate and is advantageous for achieving high glass transition temperature and high thermal resistance. However, it has been found that the use of large amount of aromatic maleimide resin (such as BMI-70 or BMI-2300) causes poor laminate formability and poor electric properties; on the other hand, the use of aliphatic long-chain maleimide resin (such as BMI-3000), while improving electric properties, greatly decreases the glass transition temperature.

Therefore, there is a need for resin composition suppliers and laminate manufacturers to develop materials capable of achieving balanced overall properties including electric properties, thermal resistance and glass transition temperature.

SUMMARY

To address the aforesaid and other problems, disclosed herein is a vinylbenzyl imide resin having any one of the following structures:

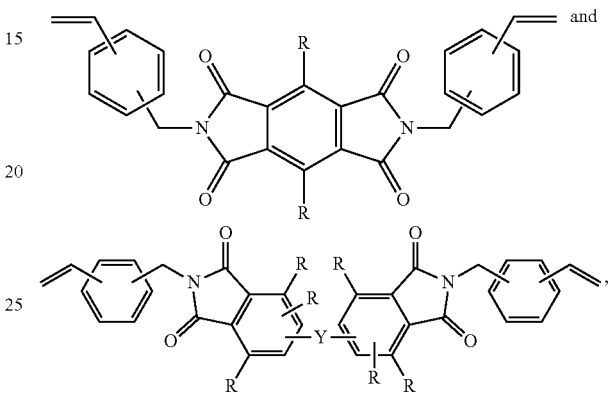

wherein Y is selected from a covalent bond, —$CH_2$—, —$CH(CH_3)$—, —$C(CH_3)_2$—, —O—, —S—, —$SO_2$—, a carbonyl group and a bisphenol A functional group; and R individually represent hydrogen or $C_1$ to $C_6$ hydrocarbyl.

In one embodiment, disclosed herein is a vinylbenzyl imide resin having any one of the following structures:

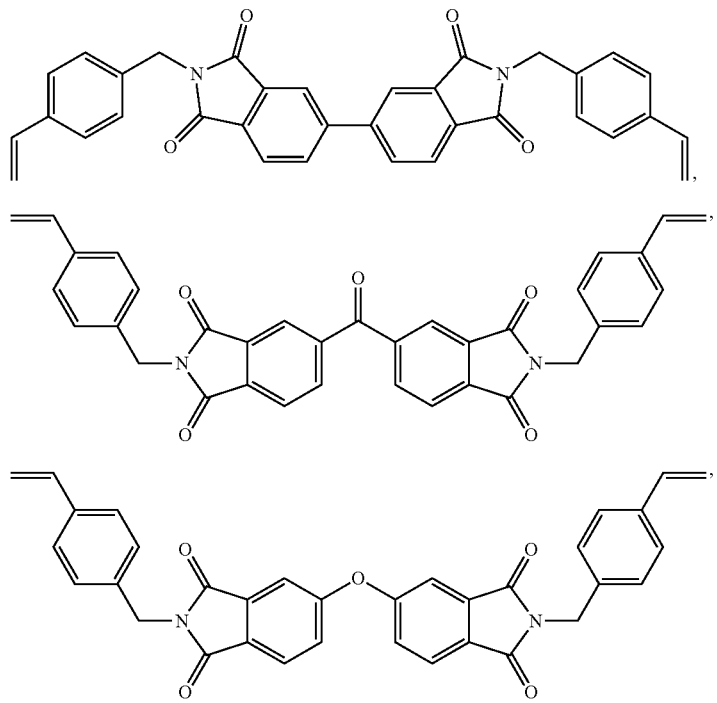

-continued

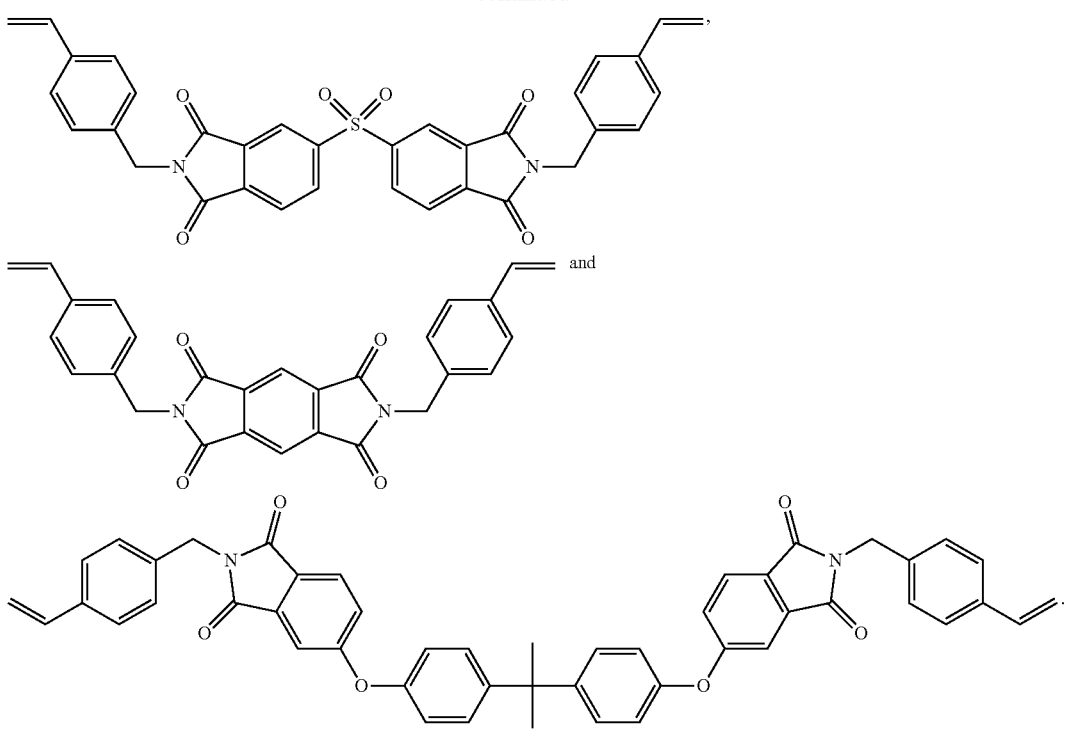

In one embodiment, the vinylbenzyl imide resin disclosed herein may have a molecular weight of between 200 and 1000.

In another aspect, disclosed herein is a method of preparing the aforesaid vinylbenzyl imide resin, comprising reacting a dianhydride and a vinyl-containing amine compound.

In another aspect, disclosed herein is a vinylbenzyl imide prepolymer, which is obtained by prepolymerization of the aforesaid vinylbenzyl imide resin and one or more of a small molecule vinyl compound, a vinyl-terminated polyphenylene oxide, a maleimide resin and a polyolefin resin.

In another aspect, disclosed herein is a resin composition, comprising: (A) the aforesaid vinylbenzyl imide resin, its prepolymer or a mixture thereof; and (B) a property modifier, comprising but not limited to a flame retardant, an inorganic filler, a curing accelerator, a curing initiator, a solvent, a silane coupling agent, a surfactant, a coloring agent, a toughening agent or a combination thereof.

In one embodiment, the resin composition of the present disclosure further comprises (C) a crosslinking agent which comprises, but not limited to, an epoxy resin, a polyphenylene oxide resin, a cyanate ester resin, a small molecule vinyl compound, a maleimide resin, a phenolic resin, a benzoxazine resin, a styrene maleic anhydride, a polyolefin resin, a polyester resin, an amine curing agent, a polyamide resin, a polyimide resin or a combination thereof.

In one embodiment, in the resin composition of the present disclosure, the weight ratio of the component (A) and the component (C) is between 6:1 and 1:6.

In one embodiment, the resin composition of the present disclosure comprises 100 parts by weight of the component (A) and 5 to 200 parts by weight of the component (C).

In another aspect, the present disclosure provides an article made from the resin composition described above, which comprises a prepreg, a resin film, a resin film with copper foil, a laminate or a printed circuit board.

In one embodiment, the article according to the present disclosure has a dielectric constant at 10 GHz as measured by reference to JIS C2565 of less than or equal to 3.2.

In one embodiment, the article according to the present disclosure has a dissipation factor at 10 GHz as measured by reference to JIS C2565 of less than or equal to 0.0030.

In one embodiment, the article according to the present disclosure has a glass transition temperature as measured by reference to IPC-TM-650 2.4.24.5 of greater than or equal to 150° C.

In one embodiment, the article according to the present disclosure has an interlayer bonding strength as measured by reference to IPC-TM-650 2.4.8 of greater than or equal to 3.70 lb/in.

In one embodiment, the article according to the present disclosure has at least one of the following properties:
  a resin flow as measured by reference to IPC-TM-650 2.3.17 of between 15% and 30%;
  a flame retardancy as measured by reference to UL94 standard of V0 or V1;
  a T288 thermal resistance as measured by reference to IPC-TM-650 2.4.24.1 of greater than or equal to 70 minutes;
  a soldering resistance as measured by reference to IPC-TM-650 2.4.23 of greater than or equal to 20 times; and
  a PCT thermal resistance as measured by reference to IPC-TM-650 2.6.16.1 of greater than or equal to 3 hours.

BRIEF DESCRIPTION OF THE DRAWINGS

The sole FIGURE illustrates the FTIR spectrum of solid product A.

DETAILED DESCRIPTION OF EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, the term "comprises," "comprising," "includes," "including," "has," "having" or any other variant thereof is construed as an open-ended transitional phrase intended to cover a non-exclusive inclusion. For example, a composition or article of manufacture that comprises a list of elements is not necessarily limited to only those elements but may include other elements not expressly listed or inherent to such composition or article of manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" or "between 1 and 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$. In addition, when a Markush group or a list of items is used to describe examples or embodiments of the present disclosure, a skilled artisan will understand that any subgroup or any combination of the members or items in the Markush group or list may also be used to describe the present disclosure. Therefore, when X is described as being "selected from a group consisting of $X_1$, $X_2$ and $X_3$" and Y is described as being "selected from a group consisting of $Y_1$, $Y_2$ and $Y_3$," the disclosure of any combination of X is $X_1$ and/or $X_2$ and/or $X_3$ and Y is $Y_1$ and/or $Y_2$ and/or $Y_3$.

The following embodiments and examples are illustrative in nature and are not intended to limit the present disclosure and its application. In addition, the present disclosure is not bound by any theory described in the background and summary above or the following embodiments or examples.

Vinylbenzyl Imide Resin

Accordingly, an object of the present disclosure is to provide a vinylbenzyl imide resin, having any one of the following structures:

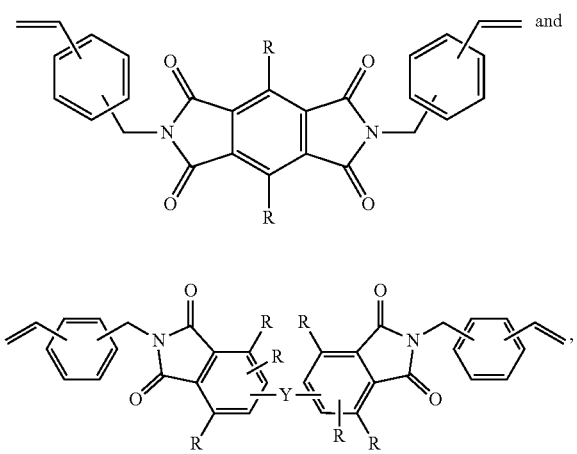

wherein Y is selected from a covalent bond, —$CH_2$—, —$CH(CH_3)$—, —$C(CH_3)_2$—, —O—, —S—, —$SO_2$—, a carbonyl group and a bisphenol A functional group; and R individually represent hydrogen or $C_1$ to $C_6$ hydrocarbyl.

The two structures shown above are commonly characterized in that they are both derived from the reaction of a dianhydride and a vinyl-containing amine compound, wherein the vinyl-containing amine compound is a vinyl-containing compound having a single amino group.

Unless otherwise specified, the vinylbenzyl imide resin described herein may also be referred to as: "vinylbenzyl imide", "vinylbenzyl imide compound", "vinylbenzyl-containing imide resin", "vinylbenzyl-containing imide", and "vinylbenzyl-containing imide compound", all of which may be used interchangeably to refer to the product obtained by reacting dianhydride and vinyl-containing amine compound (such as vinylbenzyl amine).

Unless otherwise specified, the resin disclosed herein may also comprise a compound having the chemical structure, and monomer, oligomer and polymer of the compound; for example, the vinylbenzyl imide resin may comprise monomer, oligomer and polymer of the vinylbenzyl imide.

Unless otherwise specified, bisphenol A functional group may also be referred to as phenol methane functional group or diphenol propane functional group.

In one embodiment, the vinylbenzyl imide resin has any one of the following structures:

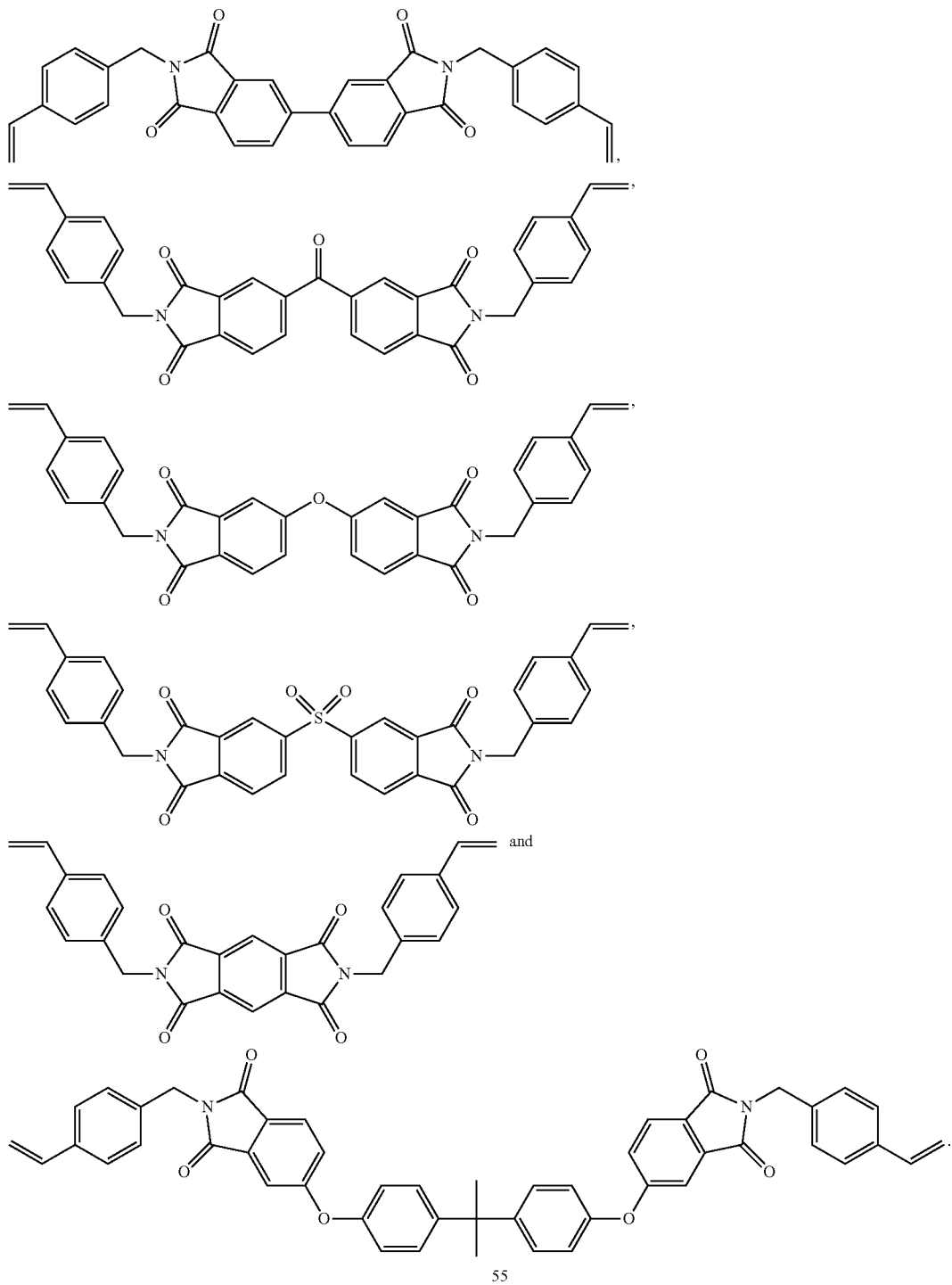

In one embodiment, the vinylbenzyl imide resin has a molecular weight of between 200 and 1000, preferably between 200 and 900, and more preferably between 400 and 850.

Method of Preparing Vinylbenzyl Imide Resin

In another aspect, disclosed herein is a method of preparing the vinylbenzyl imide resin, comprising reacting dianhydride and vinyl-containing amine compound.

Unless otherwise specified, the amount of dianhydride and vinyl-containing amine compound or the weight ratio therebetween is not particularly limited and may be adjusted according to the need.

The dianhydride (a.k.a. bifunctional anhydride) may be any one of the following compounds, but not limited thereto: 3,3',4,4'-biphenyl tetracarboxylic dianhydride (BPDA), 2,3,3',4'-biphenyl tetracarboxylic dianhydride, 4,4'-oxydiphthalic anhydride (ODPA), benzophenone tetracarboxylic dianhydride (BTDA), 3,3',4,4'-diphenyl sulfone tetracarboxylic dianhydride (SO2DPA), pyromellitic dianhydride (PMDA), 2,2-bis[4-(3,4-dicarboxyphenoxy) phenyl]propane dianhydride (BPADA), 2,2-bis(2,3-dicarboxyphenyl) propane dianhydride, bis(3,4-dicarboxyphenyl)ether dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2'-bis-(3,4-dicarboxyphenyl)hexafluoropropane dianhydride (6FDA), 1,2,3,4-cyclobutanetetracarboxylic dianhydride, 1,2,3,4-cyclopentane tetracarboxylic dianhydride, 1,2,4,5-cyclohexanetetracarboxylic dianhydride, 3,3',4,4'-dicyclohexyl tetracarboxylic acid dianhydride (HBPDA), bicyclo[2.2.1]heptane-2,3,5,6-tetracarboxylic 2,3:5,6-dianhydride, bicyclo[2.2.2]octane-2,3:5,6-tetracarboxylic dianhydride, and bicyclo[2.2.2]oct-7-ene-2,3,5,6-tetracarboxylic dianhydride.

The vinyl-containing amine compound may comprise, but not limited to, vinylbenzyl amine, such as preferably 4-vinylbenzyl amine, 3-vinylbenzyl amine or 2-vinylbenzyl amine, more preferably 4-vinylbenzyl amine.

Conventional polyimide is obtained by reacting dianhydride and bifunctional amine; since each anhydride functional group may be easily cross-linked with an amine functional group at room temperature, the dianhydride and the bifunctional amine will cross-link after they are mixed to produce polyamic acid; in addition, each anhydride is cross-linkable with the amine group, so high molecular weight (up to ten thousand or greater) polyamic acid will be produced. High molecular weight polyamic acid can hardly be used to impregnate fiberglass fabrics, and therefore conventional polyimide can hardly be used to make prepregs. The vinylbenzyl imide resin of the present disclosure is obtained by reacting a dianhydride and a vinyl-containing amine compound (such as vinylbenzyl amine) which contains only one amino group, and the vinyl group is not cross-linkable with anhydride; therefore, two ends of a dianhydride will only bond to one vinyl-containing amine to produce a low molecular weight compound (e.g., molecular weight of less than 1000, such as between 200 and 900 or between 400 and 850). The vinylbenzyl imide resin disclosed herein is a small molecule compound and is therefore useful for impregnating fiberglass fabrics to make prepregs easily.

Vinylbenzyl Imide Prepolymer

In another aspect, the present disclosure further provides a vinylbenzyl imide prepolymer and a method of preparing the same, comprising a prepolymerization step of the aforesaid vinylbenzyl imide resin with any one or more of a small molecule vinyl compound, a vinyl-terminated polyphenylene oxide, a maleimide resin and a polyolefin resin.

For example, during the prepolymerization process, a proper amount of peroxide and solvent may be optionally added. For example, after the vinylbenzyl imide resin of the present disclosure and any one or more of a small molecule vinyl compound, a vinyl-terminated polyphenylene oxide, a maleimide resin and a polyolefin resin have been dissolved in solvent and well mixed, a peroxide can be optionally added, the temperature can be increased to 70° C. to 110° C. followed by continuously stirring for 4 to 10 hours, and the product thus obtained is the vinylbenzyl imide prepolymer (liquid state, containing solvent).

For example, the vinylbenzyl imide resin, the maleimide resin, a peroxide and toluene may be well mixed, followed by heating to 70° C. to 110° C. for reaction for 4 to 10 hours to obtain the vinylbenzyl imide prepolymer.

For example, the vinylbenzyl imide resin, the small molecule vinyl compound, a peroxide and toluene may be well mixed, followed by heating to 70° C. to 110° C. for reaction for 4 to 10 hours to obtain the vinylbenzyl imide prepolymer.

The small molecule vinyl compound as used herein refers to a vinyl compound with a molecular weight of less than or equal to 1000, preferably between 100 and 900 and more preferably between 100 and 800. As used herein, the small molecule vinyl compound may be, but not limited to, divinylbenzene (DVB), bis(vinylbenzyl) ether (BVBE), 1,2-bis(vinylphenyl) ethane (BVPE), isocyanate, triallyl isocyanurate (TAIC), triallyl isocyanurate prepolymer (pre-polymer TAIC), triallyl cyanurate (TAC), triallyl cyanurate prepolymer (pre-polymer TAC), 1,2,4-trivinyl cyclohexane (TVCH), diallyl bisphenol A, styrene, acrylate (e.g., tricyclodecane di(meth)acrylate and tri(meth)acrylate) or a combination thereof.

The vinyl-terminated polyphenylene oxide is not particularly limited and may comprise any one or more commercial products, products synthesized by the applicant or a combination thereof, such as but not limited to bis(vinylbenzyl) polyphenylene oxide (e.g., OPE-2st, available from Mitsubishi Gas Chemical Co., Inc.), methacrylate polyphenylene oxide (e.g., SA-9000, available from SABIC), vinylbenzyl-modified polyphenylene oxide or chain-extended polyphenylene oxide. For example, the chain-extended polyphenylene oxide may include various polyphenylene oxide resins disclosed in the US Patent Application Publication No. 2016/0185904 A1, all of which are incorporated herein by reference in their entirety.

Maleimide resin is not particularly limited and may comprise any one or more commercial products, products synthesized by the applicant or a combination thereof, such as but not limited to 4,4'-diphenylmethane bismaleimide, oligomer of phenylmethane maleimide (a.k.a. polyphenylmethane maleimide), m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-2,2,4-trimethyl hexane, N-2,3-xylylmaleimide, N-2,6-xylenemaleimide, N-phenylmaleimide, maleimide compound containing aliphatic long chain structure, prepolymer thereof and a combination thereof.

The polyolefin resin used in the present disclosure is not particularly limited and may be any one or more commercial products or a combination thereof. Examples include but are not limited to styrene-butadiene-divinylbenzene terpolymer, styrene-butadiene-maleic anhydride terpolymer, vinyl-polybutadiene-urethane oligomer, styrene butadiene copolymer, hydrogenated styrene butadiene copolymer, styrene isoprene copolymer, hydrogenated styrene isoprene copolymer, methylstyrene copolymer, petroleum resin, cycloolefin copolymer and a combination thereof.

Unless otherwise specified, the small molecule vinyl compound, the vinyl-terminated polyphenylene oxide, the maleimide resin and the polyolefin resin described above may be present in an amount or a weight ratio adjustable according to the need without particular limitation; for example, any one or more thereof may be chosen for the purpose of prepolymerization, such as two, three, four, five or more thereof.

Resin Composition

In another aspect, disclosed herein is a resin composition, comprising: (A) the aforesaid vinylbenzyl imide resin, its prepolymer or a mixture thereof; and (B) a property modifier, comprising but not limited to a flame retardant, an inorganic filler, a curing accelerator, a curing initiator, a solvent, a silane coupling agent, a surfactant, a coloring agent, a toughening agent or a combination thereof.

Unless otherwise specified, the component (A) may comprise the vinylbenzyl imide resin, its prepolymer or a mixture thereof. If a mixture of the vinylbenzyl imide resin and the vinylbenzyl imide resin prepolymer is used, the weight ratio thereof may be adjusted according to the need without particular limitation. For example, the weight ratio of the vinylbenzyl imide resin and its prepolymer may be between 1:10 and 10:1.

The property modifier is used for modifying at least one property of the resin composition, comprising flame retardancy, thermal resistance (e.g., T288 thermal resistance, soldering resistance and thermal resistance after moisture absorption), dielectric constant, dissipation factor, toughness, reactivity, viscosity and solubility, but not limited thereto.

For example, the flame retardant may be at least one of the following compounds, but not limited thereto: bisphenol diphenyl phosphate, ammonium polyphosphate, hydroquinone bis-(diphenyl phosphate), bisphenol A bis-(diphenylphosphate), tri(2-carboxyethyl)phosphine (TCEP), tri(chloroisopropyl) phosphate, trimethyl phosphate (TMP), dimethyl methyl phosphonate (DMMP), resorcinol bis(dixylenyl phosphate) (RDXP, such as PX-200, commercially available from Daihachi Chemical Industry Co. Ltd.), phosphazene (such as SPB-100, commercially available from Otsuka Chemical Co. Ltd.), m-phenylene methylphosphonate (PMP), melamine polyphosphate, 9,10-dihydro-9-oxa-10-phosphaphenanthrene-10-oxide (DOPO), DOPO-containing phenolic resin (e.g., DOPO-HQ resin, DOPO-PN resin, and DOPO-BPN resin), di-DOPO compound, diphenyl phosphine oxide (DPPO) compound, diphenylphosphine oxide derivatives, etc. DOPO-BPN resin may be a bisphenol novolac compound such as DOPO-bisphenol A novolac (DOPO-BPAN), DOPO-bisphenol F novolac (DOPO-BPFN) and DOPO-bisphenol S novolac (DOPO-BPSN).

For example, the inorganic filler may comprise at least one of silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride and calcined kaolin. Preferably, the inorganic filler may be spherical, fibrous, plate-like, particulate, sheet-like or whisker-like and can be optionally pretreated by a silane coupling agent, such as silane (such as but not limited to siloxane).

For example, the curing accelerator or curing initiator may comprise catalysts, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may comprise metal salt compounds, such as those of manganese, iron, cobalt, nickel, copper and zinc, such as zinc octanoate or cobalt octanoate as metal catalyst. Preferably, the curing accelerator or the curing initiator may comprise a peroxide capable of producing free radicals, including but not limited to dicumyl peroxide, tert-butyl peroxybenzoate, benzoyl peroxide (BPO), 2,5-dimethyl-2,5-bis(tert-butylperoxy)hexyne-3 (25B), or bis(tert-butylperoxyisopropyl)benzene.

The purpose of adding solvent is to change the solid content of the resin composition and to adjust the viscosity of the resin composition. For example, the solvent may comprise, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

Silane coupling agent may comprise silane (such as but not limited to siloxane), which may be further categorized according to the functional groups into amino silane, epoxy silane, vinyl silane, ester silane, hydroxyl silane, isocyanate silane, methacryloyl silane and acryloyl silane.

The purpose of surfactant is to ensure uniform distribution of the inorganic filler in the resin composition.

For example, the coloring agent may comprise but not limited to dye or pigment.

The purpose of adding toughening agent is to improve the toughness of the resin composition. The toughening agent may comprise, but not limited to, rubber resin, carboxyl-terminated butadiene acrylonitrile rubber (CTBN rubber), core-shell rubber, etc.

In one embodiment, the resin composition of the present disclosure may further comprise (C) a crosslinking agent which comprises an epoxy resin, a polyphenylene oxide resin, a cyanate ester resin, a small molecule vinyl compound, a maleimide resin, a phenolic resin, a benzoxazine resin, a styrene maleic anhydride, a polyolefin resin, a polyester resin, an amine curing agent, a polyamide resin, a polyimide resin or a combination thereof.

In one embodiment, in the resin composition disclosed herein, the weight ratio of the component (A) and the component (C) is between 6:1 and 1:6, such as but not limited to between 5:1 and 1:5, 4:1 and 1:4, 3:1 and 1:3 or 2:1 and 1:2.

In one embodiment, the resin composition comprises 100 parts by weight of the component (A) and 5 to 200 parts by weight of the component (C), wherein relative to 100 parts by weight of the component (A), the component (C) is preferably 10 to 150 parts by weight and more preferably 10 to 125 parts by weight.

For example, the epoxy resin may be any epoxy resins known in the field to which this disclosure pertains, including but not limited to bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin, or a combination thereof. The novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin, wherein the phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin; the DOPO-HQ epoxy resin may be any one or more selected from DOPO-HQ-containing phenolic novolac epoxy resin, DOPO-HQ-containing cresol novolac epoxy resin and DOPO-HQ-containing bisphenol-A novolac epoxy resin.

For example, in the resin composition, the polyphenylene oxide resin used may be a hydroxyl-terminated polyphenylene oxide and various types of vinyl-terminated polyphenylene oxide described above for preparing the vinylbenzyl imide prepolymer, but not limited thereto.

For example, the cyanate ester resin is not particularly limited and may be any compound with an Ar—O—C≡N structure, wherein Ar represents a substituted or unsubstituted aromatic group, novolac, bisphenol A, bisphenol A novolac, bisphenol F, bisphenol F novolac or phenolphthalein. For example, the cyanate ester resin may be available under the tradename Primaset PT-15, PT-30S, PT-60S, CT-90, BADCY, BA-100-10T, BA-200, BA-230S, BA-300S, BTP-2500, BTP-6020S, DT-4000, DT-7000, Methylcy, and ME-240S available from Lonza.

Unless otherwise specified, in the resin composition, the small molecule vinyl compound used may be any small molecule vinyl compound useful for preparing the vinylbenzyl imide prepolymer, but not limited thereto.

Unless otherwise specified, in the resin composition, the maleimide resin used may be any maleimide resin useful for preparing the vinylbenzyl imide prepolymer, but not limited thereto.

For example, the phenolic resin may comprise but not limited to mono-functional, bifunctional or multifunctional phenolic resin, comprising phenolic resin of a resin composition conventionally useful for making prepregs, such as phenoxy resin, phenol novolac resin, etc.

For example, the benzoxazine resin includes, but not limited to, bisphenol A benzoxazine resin, bisphenol F benzoxazine resin, phenolphthalein benzoxazine resin, dicyclopentadiene benzoxazine resin, phosphorus-containing benzoxazine resin, oxydianiline benzoxazine resin, or unsaturated bond containing benzoxazine resin, such as but not limited to LZ-8270, LZ-8280 or LZ-8290 available from Huntsman or HFB-2006M available from Showa High Polymer.

For example, in the styrene maleic anhydride, the ratio of styrene (S) and maleic anhydride (MA) may be for example 1/1, 2/1, 3/1, 4/1, 6/1, 8/1 or 12/1, including styrene maleic anhydride copolymers such as SMA-1000, SMA-2000, SMA-3000, EF-30, EF-40, EF-60 and EF-80 available from Cray Valley.

Unless otherwise specified, in the resin composition, the polyolefin resin used may be any polyolefin resin useful for preparing the vinylbenzyl imide prepolymer, but not limited thereto.

For example, the polyester resin may be prepared by esterification of dicarboxylic aromatic compounds with dihydroxyl aromatic compounds. Examples include, but not limited to, HPC-8000T65, available from D.I.C. Corporation.

For example, the amine curing agent may include, but not limited to, any one or a combination of diamino diphenyl sulfone, diamino diphenyl methane, diamino diphenyl ether, diamino diphenyl sulfide and dicyandiamide (DICY).

For example, the polyamide resin may be any polyamide resin known in the field to which this disclosure pertains, including but not limited to various commercially available polyamide resin products.

For example, the polyimide resin may be any polyimide resin known in the field to which this disclosure pertains, including but not limited to various commercially available polyimide resin products.

In one embodiment, the crosslinking agent is preferably a polyphenylene oxide resin, a small molecule vinyl compound, a maleimide resin, a polyolefin resin or a combination thereof.

Article Made From Resin Composition

The resin composition according to each of the various embodiments may be processed by various methods to make different articles, such as those suitable for use as components in electronic products, including but not limited to a prepreg, a resin film, a resin film with copper foil, a laminate or a printed circuit board.

For example, the resin composition according to each of the various embodiments may be coated on a polyester (PET) film or a polyimide (PI) film, followed by baking and heating to the semi-cured state (B-Staged) to obtain the resin film.

For example, the resin composition according to each of the various embodiments may be coated on a copper foil, followed by baking and heating to the semi-cured state to obtain the resin film with copper foil, such as a resin coated copper (RCC).

For example, the resin composition according to each of the various embodiments may be used to make a prepreg, which has an reinforcement material and a layered structure (insulation layer) formed thereon, wherein the layered structure is made by heating the resin composition to a semi-cured state at a temperature for example between 130° C. and 190° C. For example, the reinforcement material may be any one of a fiber material, woven fabric, non-woven fabric, liquid crystal resin film, polyester (PET) film and polyimide (PI) film, and the woven fabric preferably comprises fiberglass fabrics. Types of fiberglass fabrics are not particularly limited and may be any commercial fiberglass fabric useful for various printed circuit boards, such as E-glass fabric, D-glass fabric, S-glass fabric, T-glass fabric, L-glass fabric or NE-glass fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent.

For example, resin compositions of various embodiments of the present disclosure may be made into a laminate, such as a copper-clad laminate, which comprises two copper foils and an insulation layer disposed between the copper foils, wherein the insulation layer is made by curing the resin compositions at high temperature and high pressure, a suitable curing temperature being for example between 190° C. and 220° C. and preferably between 195° C. and 210° C. and a suitable curing time being 60 to 180 minutes and preferably 100 to 150 minutes. The insulation layer may be the aforesaid prepreg or resin film. In one preferred embodiment, the laminate is a copper-clad laminate.

In one embodiment, the laminate may be further processed by trace formation processes to provide a printed circuit board.

Property Measurements

The resin compositions and various articles made therefrom according to the present disclosure, such as a prepreg, a resin film, a resin film with copper foil, a laminate or a printed circuit board, may achieve one, more or all of the following desirable properties:

(1) a better resin flow as measured by reference to IPC-TM-650 2.3.17; such as the resin flow is between 15% and 30%;

(2) a better resin filling property; for example, a copper-clad laminate is sectioned by using conventional microsection equipment and observed with an optical microscope and a scanning electron microscope to determine the presence or absence of voids in the resin-filled space between traces; the absence of void represents acceptable resin filling property (OK), and the presence of voids represents unacceptable resin filling property (NG);
(3) better flame retardancy, such as a flame retardancy as measured by reference to the UL94 standard of V0 or V1, such as V0;
(4) higher glass transition temperature (Tg) as measured by reference to IPC-TM-650 2.4.24.5; for example, the glass transition temperature is greater than or equal to 150° C., such as between 150° C. and 180° C.;
(5) better T288 thermal resistance as measured by reference to IPC-TM-650 2.4.24.1; for example, the time to delamination is greater than or equal to 70 minutes, such as greater than or equal to 90 minutes, 120 minutes, 180 minutes or longer;
(6) better soldering resistance as measured by reference to IPC-TM-650 2.4.23; for example, the time to delamination is greater than or equal to 20 cycles, such as greater than or equal to 25 cycles, 30 cycles, 40 cycles or greater;
(7) better PCT thermal resistance as measured by reference to IPC-TM-650 2.6.16.1; such as no interlayer delamination occurs after three or more hours of moisture absorption followed by immersion in a 288° C. solder bath for 20 seconds and then removed;
(8) lower dielectric constant at 10 GHz as measured by reference to JIS C2565; for example, the dielectric constant is less than or equal to 3.2, such as between 2.8 and 3.2;
(9) lower dissipation factor at 10 GHz as measured by reference to JIS C2565; for example, the dissipation factor is less than or equal to 0.0030, such as between 0.0020 and 0.0030;
(10) higher interlayer bonding strength as measured by reference to IPC-TM-650 2.4.8; such as the interlayer bonding strength is greater than or equal to 3.70 lb/in, such as between 3.70 lb/in and 4.20 lb/in.

EXAMPLES

Materials and reagents used in Preparation Examples, Examples and Comparative Examples disclosed herein are listed below:
TPP: triphenylphosphine, available from Sigma Aldrich;
OPE-2st: vinylbenzyl-terminated polyphenylene oxide resin, available from Mitsubishi Gas Chemical Co., Inc.;
Hydroxyl imide resin: as shown below, synthesized by the Applicant:

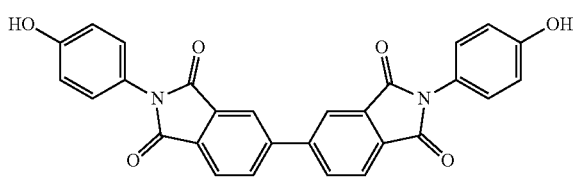 [SMILES: O=C1c2ccc(-c3ccc4c(c3)C(=O)N(c3ccc(O)cc3)C4=O)cc2C(=O)N1c1ccc(O)cc1]

BMI-70: aromatic maleimide resin, available from K.I Chemical Industry Co., Ltd.;
BMI-3000: aliphatic long-chain maleimide resin, available from Designer Molecules Inc.;
BPDA: 3,3',4,4'-biphenyl tetracarboxylic dianhydride, available from Sigma Aldrich;
BTDA: 3,3',4,4'-benzophenone tetracarboxylic dianhydride, available from Sigma Aldrich;
SO2DPA: 3,3',4,4'-diphenyl sulfone tetracarboxylic dianhydride, available from Sigma Aldrich;
ODPA: 4,4'-oxydiphthalic dianhydride, available from Sigma Aldrich;
PMDA: pyromellitic dianhydride, available from Sigma Aldrich;
BPADA: 2,2-bis[4-(3,4-dicarboxyphenoxy)phenyl]propane dianhydride, available from Sigma Aldrich;
4-Vinylbenzyl amine: available from TCI America;
25B: 2,5-dimethyl-2,5-bis(t-butylperoxy)hexyne-3, commercially available from NOF Corporation;
BPO: benzoyl peroxide, available from NOF Corporation;
SC2500: spherical silica, available from Admatechs;
Toluene: available from Chambeco Group;
PPO-1: chain-extended vinylbenzyl polyphenylene oxide resin, synthesized by reference to
US Patent Application Publication No. 2016/0185904 A1;
Ricon257: styrene-butadiene-divinylbenzene terpolymer, available from Cray Valley;
Ricon184MA6: styrene-butadiene-maleic anhydride terpolymer, available from Cray Valley;
FR-1: di-DPPO flame retardant (bis-diphenylphosphine oxide, Bis-DPPO), disclosed in CN
Patent Application Publication No. 105440645 A.

Preparation of Vinylbenzyl Imide Resins

Preparation Example 1

29.4 g (0.1 mole) of 3,3',4,4'-biphenyl tetracarboxylic dianhydride (BPDA) solid powder and 33.25 g (0.25 mole) of 4-vinylbenzyl amine liquid were added to a solvent mixture comprising 150 g of dimethylacetamide and 50 g of toluene, heated in a glass stirred reaction tank, followed by stirring at 35° C. until the solid powder was completed dissolved to form a solution. After proceeding the reaction at 35° C. for 8 hours, 0.5 g of triphenylphosphine (TPP) and 1 g of acetic anhydride were added, followed by heating to 180° C. to proceed the reaction for 8 hours to obtain a yellow solid state Product A as shown below, which is a vinylbenzyl imide resin.

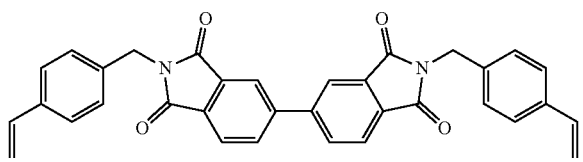 [SMILES: C=Cc1ccc(CN2C(=O)c3ccc(-c4ccc5c(c4)C(=O)N(Cc4ccc(C=C)cc4)C5=O)cc3C2=O)cc1]

Product A was analyzed by using transmission type Fourier transform infrared spectroscopy (FTIR), with the result shown in FIG. 1. FTIR analysis confirmed that the product obtained is the vinylbenzyl imide resin as shown above, wherein T % represents transmittance (%) and cm$^{-1}$ represents wavenumber.

Preparation Example 2

Similar to the synthesis method of vinylbenzyl imide resin disclosed in Preparation Example 1, the difference lies in that 66.5 g (0.5 mole) of 4-vinylbenzyl amine was used, and finally a yellow solid state Product B was obtained.

Preparation Example 3

Similar to the synthesis method of vinylbenzyl imide resin disclosed in Preparation Example 1, the difference lies in that 26.6 g (0.2 mole) of 4-vinylbenzyl amine was used, and finally a yellow solid state Product C was obtained.

Preparation Example 4

Similar to the synthesis method of vinylbenzyl imide resin disclosed in Preparation Example 1, the difference lies in that 32.2 g (0.1 mole) of 3,3',4,4'-benzophenone tetracarboxylic dianhydride (BTDA) was used to replace 29.4 g of 3,3',4,4'-biphenyl tetracarboxylic dianhydride (BPDA), and yellow solid state Product D was obtained, as shown below.

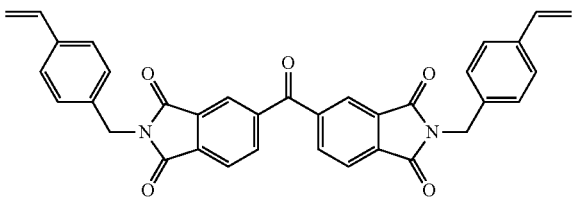 [SMILES: C=Cc1ccc(CN2C(=O)c3ccc(C(=O)c4ccc5c(c4)C(=O)N(Cc4ccc(C=C)cc4)C5=O)cc3C2=O)cc1]

Preparation Example 5

Similar to the synthesis method of vinylbenzyl imide resin disclosed in Preparation Example 1, the difference lies in that 31.0 g (0.1 mole) of 4,4'-oxydiphthalic dianhydride (ODPA) was used to replace 29.4 g of 3,3',4,4'-biphenyl tetracarboxylic dianhydride (BPDA), and yellow solid state Product E was obtained, as shown below.

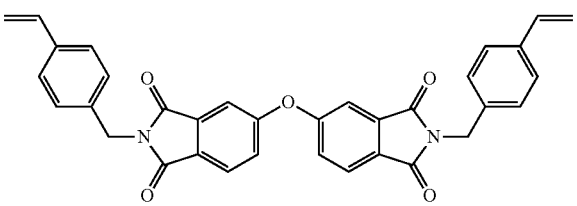

Preparation Example 6

Similar to the synthesis method of vinylbenzyl imide resin disclosed in Preparation Example 1, the difference lies in that 35.8 g (0.1 mole) of 3,3',4,4'-diphenyl sulfone tetracarboxylic dianhydride (SO2DPA) was used to replace 29.4 g of 3,3',4,4'-biphenyl tetracarboxylic dianhydride (BPDA), and yellow solid state Product F was obtained, as shown below.

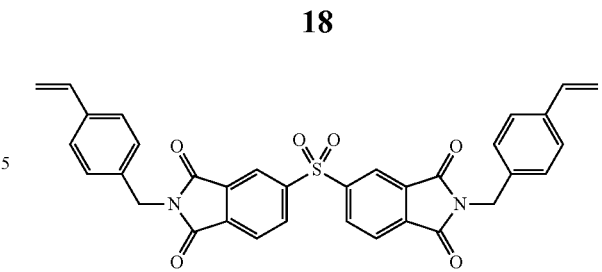

Preparation Example 7

Similar to the synthesis method of vinylbenzyl imide resin disclosed in Preparation Example 1, the difference lies in that 21.8 g (0.1 mole) of pyromellitic dianhydride (PMDA) was used to replace 29.4 g of 3,3',4,4'-biphenyl tetracarboxylic dianhydride (BPDA), and yellow solid state Product G was obtained, as shown below.

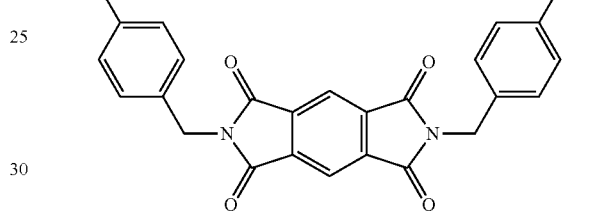

Preparation Example 8

Similar to the synthesis method of vinylbenzyl imide resin disclosed in Preparation Example 1, the difference lies in that 52.0 g (0.1 mole) of 2,2-bis[4-(3,4-dicarboxyphenoxy)phenyl]propane dianhydride (BPADA) was used to replace 29.4 g of 3,3',4,4'-biphenyl tetracarboxylic dianhydride (BPDA), and yellow solid state Product H was obtained, as shown below.

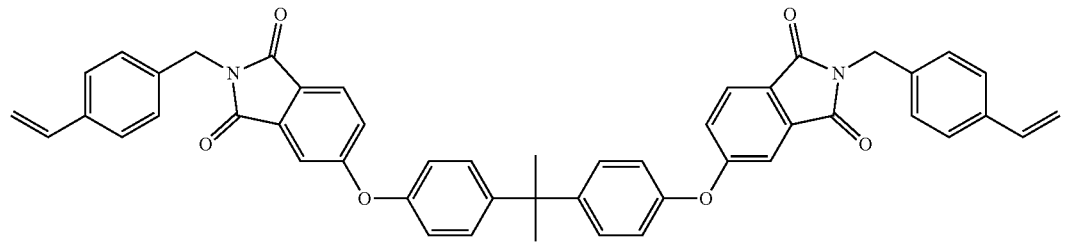 [SMILES: C=Cc1ccc(CN2C(=O)c3ccc(Oc4ccc(C(C)(C)c5ccc(Oc6ccc7c(c6)C(=O)N(Cc6ccc(C=C)cc6)C7=O)cc5)cc4)cc3C2=O)cc1]

Preparation of Vinylbenzyl Imide Prepolymers

Preparation Example 9

40 g of vinylbenzyl imide resin (Product A), 60 g of BMI-70 (aromatic maleimide resin) and 0.5 g of benzoyl peroxide (BPO) were added to a solvent mixture comprising 50 g of dimethylacetamide and 250 g of toluene, stirred in the stirred tank until the solid powder was completed dissolved, followed by heating to 85° C. and stirring for 8 hours, and finally removing the solvent with a conventional technique to obtain liquid state Product I as a vinylbenzyl imide prepolymer.

Preparation Example 10

Similar to the synthesis method of vinylbenzyl imide prepolymer disclosed in Preparation Example 9, the difference lies in that 50 g of vinylbenzyl imide resin (Product A) was reacted with 50 g of BMI-70, to obtain liquid state Product J, which is also a vinylbenzyl imide prepolymer.

Samples (specimens) were prepared as described below and tested and analyzed under specified conditions below.

1. Prepreg

Resin composition from each Example and Comparative Example was respectively well-mixed to form a varnish, which was then loaded to an impregnation tank; a fiberglass fabric (e.g., 2116 E-glass fiber fabric or 1080 L-glass fiber fabric, available from Asahi) was impregnated into the impregnation tank to adhere the resin composition onto the fiberglass fabric, followed by heating and baking at 135° C. for about 2 minutes to obtain a prepreg.

2. Copper-Containing Laminate (a.k.a. Copper-Clad Laminate, 5-Ply, Obtained by Laminating Five Prepregs)

Two 18 μm HVLP (Hyper Very Low Profile) copper foils and five prepregs obtained from 2116 fiberglass fabrics impregnated with each Example or Comparative Example and having a resin content of about 52% were prepared and stacked in the order of copper foil, five prepregs and copper foil, followed by lamination under vacuum at a pressure of 30 kgf/cm² and 195° C. for 100 minutes to form a copper-clad laminate. Insulation layers were formed by laminating five sheets of prepreg between the two copper foils, and the resin content of the insulation layers is about 52%.

3. Copper-Free Laminate (5-Ply, Obtained by Laminating Five Prepregs)

Each copper-containing laminate (5-ply) was etched to remove the two copper foils to obtain a copper-free laminate (5-ply) obtained by laminating five prepregs and having a resin content of about 52%.

4. Copper-Free Laminate (2-Ply, Obtained by Laminating Two Prepregs)

Two 18 μm HVLP copper foils and two prepregs obtained from 1080 L-glass fabrics impregnated with each Example or Comparative Example and having a resin content of about 68% were prepared and stacked in the order of copper foil, two prepregs and copper foil, followed by lamination under vacuum at a pressure of 30 kgf/cm² and 195° C. for 100 minutes to form a two-ply copper-clad laminate. Then each copper-clad laminate obtained above was etched for removing the two copper foils so as to obtain the copper-free laminate (2-ply). Each insulation laminate was formed by laminating two prepregs, and the resin content thereof was about 68%.

Test items and test methods are described below.

1. Resin Flow

By reference to IPC-TM-650 2.3.17, four sheets of (4.0±0.010 inch)×(4.0±0.010 inch) prepreg obtained by impregnating 2116 E-fiberglass fabrics were prepared and weighed (the weight is referred to as Wo); after that, the four prepregs were stacked in the order of steel plate/release film/four prepregs/release film/steel plate and placed into a lamination machine for lamination at a temperature of 171±3° C. and a pressure of 200±10 psi for five minutes; then the sample was removed and cooled to room temperature and punched with a circular punching machine to obtain a circular sample with a diameter of 3.192 inch (81.1 mm); the circular sample was weighed (the weight is referred to as Wd), and the resin flow (%) is calculated as follow:

resin flow %=[(Wo−2Wd)/Wo]×100%

For example, the resin flow is preferably 15% to 30%. Resin composition with a resin flow of greater than 30% is undesirable in that resin cannot be completely impregnated and retained on the fiberglass fabrics, which results in insufficient resin content after lamination due to overly high flowability of resin composition; in contrast, resin composition with a resin flow of less than or equal to 14% is undesirable for the poor resin filling property of resin due to insufficient flowability.

2. Resin Filling Property

Two prepregs obtained from 2116 E-fiberglass fabrics were covered on both sides with a 2-ounce HTE (high temperature elongation) copper foil and laminated to form a copper-clad laminate; conventional lithography and etching processes were performed on the surface copper foils to form a core with surface traces; after brown oxide treatment on the surface traces, two surfaces were respectively stacked with three prepregs obtained from 1080 E-fiberglass fabrics and a 2-ounce HTE foil, followed by lamination to form a second copper-clad laminate. A copper-clad laminate is sectioned by using conventional microsection equipment and observed with an optical microscope and a scanning electron microscope (SEM) to determine the presence or absence of voids in the resin filled between traces; the presence of voids represents unacceptable resin filling property (NG), and the absence of void represents acceptable resin filling property (OK).

3. Flame Retardancy Test

In the flame retardancy test, a 125 mm×13 mm copper-free laminate specimen (obtained by laminating five prepregs) was measured in accordance with the UL94 standard to evaluate flame retardancy rating represented by V-0, V-1, or V-2, wherein V-0 indicates a superior flame retardancy to V-1, V-1 indicates a superior flame retardancy to V-2, and burn-out is the worst.

4. Glass Transition Temperature (Tg)

The copper-free laminate (obtained by laminating five prepregs) specimen was subject to glass transition temperature measurement. A thermomechanical analyzer (TMA) was used by reference to IPC-TM-650 2.4.24.5 "Glass Transition Temperature and Thermal Expansion of Materials Used in High Density Interconnection (HDI) and Microvias—TMA Method" to measure each specimen.

5. Thermal Resistance (T288)

The copper-containing laminate (obtained by laminating five prepregs) specimen was used in the T288 thermal resistance test. At a constant temperature 288° C., a thermomechanical analyzer (TMA) was used by reference to IPC-TM-650 2.4.24.1 "Time to Delamination (TMA Method)" to measure each specimen and record the time to delamination. Generally, longer time to delamination represents better thermal resistance of the copper-containing laminate made from the resin composition.

6. Soldering Resistance (S/D, Solder Dipping Test)

In the soldering resistance test, by reference to IPC-TM-650 2.4.23, the copper-containing laminate (obtained by laminating five prepregs) specimen was immersed in a 288° C. solder bath for 10 seconds as one cycle, removed and placed under room temperature for about 10 seconds, and then immersed in the solder bath for 10 seconds, removed and placed under room temperature for about 10 seconds. The processes were repeated to measure the total cycles before the specimen occurs delamination. In general, greater number of total cycles before delamination in the solder dipping test indicates that the article made from the resin composition (e.g., copper-clad laminate) has better thermal resistance.

7. Thermal Resistance After Moisture Absorption (Pressure Cooking Test)

The copper-free laminate specimen (obtained by laminating five prepregs) with surface copper foils etched and removed was subject to the pressure cooking test (PCT) by reference to IPC-TM-650 2.6.16.1 for three hours of moisture absorption and then immersed in a 288° C. solder bath for 20 seconds and then removed and observed to determine whether interlayer delamination occurs; absence of delamination represents "pass" and presence of delamination represents "fail".

8. Dielectric Constant (Dk) and Dissipation Factor (Df)

In dielectric constant and dissipation factor measurements, the copper-free laminate specimen (obtained by laminating two prepregs) was tested by using a microwave dielectrometer available from AET Corp. by reference to JIS C2565 "Measuring Methods for Ferrite Cores for Microwave Device" at 10 GHz for analyzing each specimen. Lower dielectric constant and lower dissipation factor represent better dielectric properties of the specimen. A difference in Dk of greater than 0.05 represents a significant difference in dielectric constant in different laminates. A difference in Df of greater than 0.0005 represents a significant difference in dissipation factor in different laminates.

9. Interlayer Bonding Strength

The copper-containing laminate (5-ply) was cut into a rectangle with a width of 12.7 mm and a length of greater than 60 mm and tested by using a tensile strength tester by reference to IPC-TM-650 2.4.8 with the proviso that the surface copper foil was not etched off and the measurement position was set at the interface between the second prepreg layer and the third prepreg layer; under room temperature (about 25° C.), the cured insulation laminate was tested to measure the force (lb/in) required to separate the two layers. A difference in interlayer bonding strength of greater than 0.1 lb/in represents a significant difference.

Results of Examples and Comparative Examples are listed in Table 1 to Table 3.

TABLE 1

Resin compositions of Examples and Comparative Examples (in part by weight) and test results

| Composition | Component | | E1 | E2 | E13 | C1 | C2 | C3 | C4 |
|---|---|---|---|---|---|---|---|---|---|
| imide | vinylbenzyl imide resin | Product A | 100 | | 30 | | | | |
| | vinylbenzyl imide prepolymer | Product I | | 100 | 70 | | | | |
| | hydroxyl imide resin | | | | | | | | 100 |
| | aromatic maleimide resin | BMI-70 | | | | 100 | | | |
| | aliphatic long-chain maleimide resin | BMI-3000 | | | | | 100 | | |
| dianhydride | 3,3',4,4'-biphenyl tetracarboxylic dianhydride | BPDA | | | | | | 47 | |
| vinyl amine compound | 4-vinylbenzyl amine | | | | | | | 53 | |
| peroxide | 2,5-dimethyl-2,5-bis(t-butyl peroxy)hexyne-3 | 25B | 1 | 1 | 1 | 1 | 1 | 1 | 1 |
| inorganic filler | spherical silica | SC2500 | 50 | 50 | 50 | 50 | 50 | 50 | 50 |
| solvent | toluene | toluene | 100 | 100 | 100 | 100 | 100 | 100 | 100 |

| Property | Test item (method) | unit | E1 | E2 | E13 | C1 | C2 | C3 | C4 |
|---|---|---|---|---|---|---|---|---|---|
| resin flow | | % | 21 | 27 | 23 | >30 | 26 | 21 | 19 |
| resin filling property | SEM observation | NA | OK | OK | OK | NG | OK | OK | OK |
| glass transition temperature (Tg) | Tg (TMA) | ° C. | 150 | 160 | 155 | — | 60 | 165 | 120 |
| 288° C. thermal resistance | T288 (TMA) | minutes | >70 | >70 | >70 | — | >70 | >70 | 15 |
| soldering resistance | S/D | cycles | >20 | >20 | >20 | — | >20 | >20 | 12 |
| thermal resistance after moisture absorption | pressure cooking test (PCT, 3 hours) | NA | pass | pass | pass | — | pass | pass | fail |
| dielectric constant | dielectric constant at 10 GHz | NA | 2.85 | 2.89 | 2.88 | — | 2.78 | 3.65 | 3.56 |
| dissipation factor | dissipation factor at 10 GHz | NA | 0.0024 | 0.0025 | 0.0025 | — | 0.0021 | 0.0038 | 0.0067 |
| interlayer bonding strength | bonding strength between layers | lb/in | 4.05 | 4.08 | 4.08 | — | 3.86 | 3.07 | 3.18 |

TABLE 2

Resin compositions of Examples (in part by weight) and test results

| Composition | Component | | E3 | E4 | E5 | E6 | E7 | E8 | E9 | E10 |
|---|---|---|---|---|---|---|---|---|---|---|
| imide | vinylbenzyl imide prepolymer | Product I | | | | 65 | | | | |
| | vinylbenzyl imide resin | Product A | 65 | 55 | 80 | | 45 | 70 | 50 | 100 |
| | hydroxyl imide resin | | | | | | | | | |
| | aromatic maleimide resin | BMI-70 | | | | | | | | |
| | aliphatic long-chain maleimide resin | BMI-3000 | | | | | | | | |
| polyphenylene oxide resin | chain-extended vinylbenzyl-terminated polyphenylene oxide resin | PPO-1 | | | | | | 30 | 20 | |
| | vinylbenzyl-terminated polyphenylene oxide resin | OPE-2st | 35 | 45 | 20 | 35 | 55 | | 30 | 10 |
| polyolefin resin | styrene-butadiene-divinyl benzene terpolymer | Ricon257 | | | | | | | | 5 |
| | styrene-butadiene-maleic anhydride terpolymer | Ricon184MA6 | | | | | | | | 2 |
| flame retardant | di-DPPO flame retardant | FR-1 | 55 | 55 | 55 | 55 | 55 | 55 | 55 | 55 |
| peroxide | 2,5-dimethyl-2,5-bis(t-butyl peroxy)hexyne-3 | 25B | 1 | 1 | 1 | 1 | 1 | 1 | 1 | 1 |
| inorganic filler | spherical silica | SC2500 | 50 | 50 | 50 | 50 | 50 | 50 | 50 | 50 |
| solvent | toluene | toluene | 100 | 100 | 100 | 100 | 100 | 100 | 100 | 100 |

| Property | Test item (method) | unit | E3 | E4 | E5 | E6 | E7 | E8 | E9 | E10 |
|---|---|---|---|---|---|---|---|---|---|---|
| resin flow | | % | 21 | 20 | 26 | 24 | 15 | 25 | 21 | 29 |
| resin filling property | SEM observation | NA | OK | OK | OK | OK | OK | OK | OK | OK |
| flame retardancy | UL94 | NA | V-0 | V-0 | V-0 | V-0 | V-0 | V-0 | V-0 | V-0 |
| glass transition temperature (Tg) | Tg (TMA) | °C. | 160 | 160 | 169 | 174 | 172 | 177 | 172 | 163 |
| 288°C. thermal resistance | T288 (TMA) | minutes | >70 | >70 | >70 | >70 | >70 | >70 | >70 | >70 |
| soldering resistance | S/D | cycles | >20 | >20 | >20 | >20 | >20 | >20 | >20 | >20 |
| thermal resistance after moisture absorption | pressure cooking test (PCT, 3 hours) | NA | pass | pass | pass | pass | pass | pass | pass | pass |
| dielectric constant | dielectric constant at 10 GHz | NA | 3.02 | 3.08 | 3.02 | 3.04 | 3.06 | 3.11 | 2.99 | 2.99 |
| dissipation factor | dissipation factor at 10 GHz | NA | 0.0024 | 0.0027 | 0.0024 | 0.0025 | 0.0029 | 0.0028 | 0.0027 | 0.0022 |
| interlayer bonding strength | bonding strength between layers | lb/in | 4.06 | 3.95 | 4.13 | 4.10 | 4.12 | 4.16 | 4.00 | 4.01 |

TABLE 3

Resin compositions of Examples and Comparative Examples (in part by weight) and test results

| Composition | Component | | E11 | C5 | C6 | C7 | E12 | C8 | C9 | C10 |
|---|---|---|---|---|---|---|---|---|---|---|
| imide | vinylbenzyl imide prepolymer | Product I | | | | | | | | |
| | vinylbenzyl imide resin | Product A | 100 | | | | 15 | | | |
| | hydroxyl imide resin | | | 100 | | | | 65 | | |
| | aromatic maleimide resin | BMI-70 | | | 100 | | | | | 65 |
| | aliphatic long-chain maleimide resin | BMI-3000 | | | | 100 | | | 65 | |
| polyphenylene oxide resin | chain-extended vinylbenzyl-terminated polyphenylene oxide resin | PPO-1 | | | | | | | | |
| | vinylbenzyl-terminated polyphenylene oxide resin | OPE-2st | 20 | 10 | 10 | 20 | 85 | 35 | 35 | 35 |
| polyolefin resin | styrene-butadiene-divinyl benzene terpolymer | Ricon257 | 5 | 5 | 5 | 5 | | | | |
| | styrene-butadiene-maleic anhydride terpolymer | Ricon184MA6 | 2 | 2 | 2 | 2 | | | | |
| flame retardant | di-DPPO flame retardant | FR-1 | 55 | 55 | 55 | 55 | 55 | 55 | 55 | 55 |
| peroxide | 2,5-dimethyl-2,5-bis(t-butyl peroxy)hexyne-3 | 25B | 1 | 1 | 1 | 1 | 1 | 1 | 1 | 1 |

TABLE 3-continued

Resin compositions of Examples and Comparative Examples (in part by weight) and test results

| | | | E11 | C5 | C6 | C7 | E12 | C8 | C9 | C10 |
|---|---|---|---|---|---|---|---|---|---|---|
| inorganic filler | spherical silica | SC2500 | 50 | 50 | 50 | 50 | 50 | 50 | 50 | 50 |
| solvent | toluene | toluene | 100 | 100 | 100 | 100 | 100 | 100 | 100 | 100 |

| Property | Test item (method) | unit | E11 | C5 | C6 | C7 | E12 | C8 | C9 | C10 |
|---|---|---|---|---|---|---|---|---|---|---|
| resin flow | | % | 28 | 27 | 28 | 25 | 11 | 14 | 13 | 12 |
| resin filling property | SEM observation | NA | OK | OK | OK | OK | NG | NG | NG | NG |
| flame retardancy | UL94 | NA | V-0 | V-0 | V-0 | V-0 | V-0 | V-0 | V-0 | V-0 |
| glass transition temperature (Tg) | Tg (TMA) | °C. | 177 | 143 | 185 | 100 | 175 | 155 | 125 | 215 |
| 288° C. thermal resistance | T288 (TMA) | minutes | >70 | 35 | 30 | 45 | >70 | 15 | >70 | >70 |
| soldering resistance | S/D | cycles | >20 | 15 | 15 | 15 | >20 | 16 | >20 | >20 |
| thermal resistance after moisture absorption | pressure cooking test (PCT, 3 hours) | NA | pass | fail | fail | fail | pass | fail | pass | pass |
| dielectric constant | dielectric constant at 10 GHz | NA | 3.01 | 3.27 | 3.76 | 3.02 | 3.14 | 3.45 | 3.22 | 3.98 |
| dissipation factor | dissipation factor at 10 GHz | NA | 0.0028 | 0.0046 | 0.0098 | 0.0024 | 0.0030 | 0.0055 | 0.0028 | 0.0061 |
| interlayer bonding strength | bonding strength between layers | lb/in | 4.11 | 3.76 | 2.67 | 2.89 | 2.76 | 2.78 | 3.05 | 2.61 |

The following observations can be made from Table 1 to Table 3.

E1 (containing vinylbenzyl imide resin) in contrast to C1 (containing aromatic maleimide resin, such as BMI-70) has better prepreg formability, as C1 failed to form a prepreg, indicating C1 had overly high resin flow of resin composition when being impregnated on fiberglass fabric and baked to the semi-cured state, such that the resin content of the prepreg is too low to make a laminate specimen for other property tests (test unavailable is labeled as "-"); in addition, E1 in contrast to C2 (containing aliphatic long-chain maleimide resin) has better glass transition temperature and interlayer bonding strength.

E1 in contrast to C3 (adding 3,3',4,4'-biphenyl tetracarboxylic dianhydride and 4-vinylbenzyl amine to the composition) produces a laminate with better dielectric constant, dissipation factor and interlayer bonding strength.

E1 in contrast to C4 (containing hydroxyl imide resin) has better glass transition temperature, thermal resistance, interlayer bonding strength, dielectric constant and dissipation factor.

E2 (containing vinylbenzyl imide prepolymer) in contrast to E1 has even higher glass transition temperature.

Comparison between Examples and Comparative Examples shows that, in contrast to the conventional aromatic maleimide resins and aliphatic long-chain maleimide resins, using the vinylbenzyl imide resin or its prepolymer may balance the benefits of low dielectric constant, low dissipation factor and high glass transition temperature and various thermal resistance properties.

In addition, it is found that, at a specific ratio, resin compositions containing vinylbenzyl imide resin or its prepolymer may achieve overall excellent properties at the same time, including a dielectric constant at 10 GHz≤3.2, a dissipation factor at 10 GHz≤0.0030, a glass transition temperature ≥150° C. and an interlayer bonding strength ≥3.70 lb/in.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A vinylbenzyl imide resin having any one of the following structures:

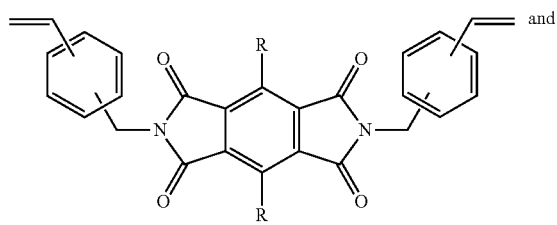

-continued
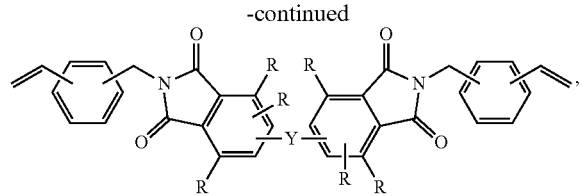
wherein Y is selected from a covalent bond, —CH$_2$—, —CH(CH$_3$)—, —C(CH$_3$)$_2$—, —O—, —S—, —SO$_2$—, a carbonyl group and a bisphenol A functional group; and
R individually represent hydrogen or C$_1$ to C$_6$ hydrocarbyl.
2. The vinylbenzyl imide resin of claim 1, having any one of the following structures:
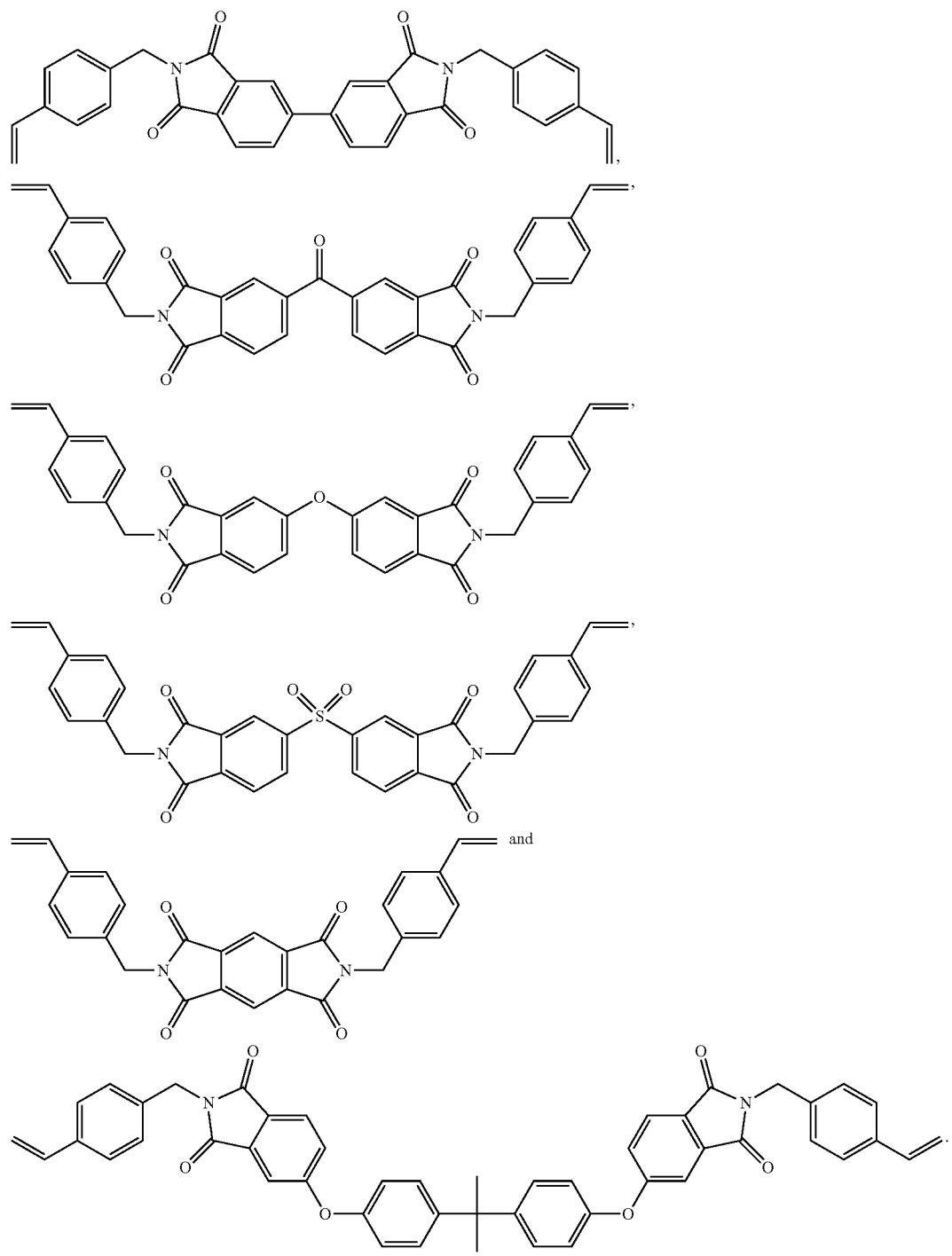

3. The vinylbenzyl imide resin of claim 1, which has a molecular weight of between 200 and 1000.

4. A method of preparing the vinylbenzyl imide resin of claim 1, comprising a step of reacting a dianhydride and a vinyl-containing amine compound.

5. A vinylbenzyl imide prepolymer obtained by prepolymerization of the vinylbenzyl imide resin of claim 1 and any one or more of a small molecule vinyl compound, a vinyl-terminated polyphenylene oxide, a maleimide resin and a polyolefin resin.

6. A resin composition, comprising: (A) the vinylbenzyl imide resin of claim 1, its prepolymer or a mixture thereof; and (B) a property modifier, comprising a flame retardant, an inorganic filler, a curing accelerator, a curing initiator, a solvent, a silane coupling agent, a surfactant, a coloring agent, a toughening agent or a combination thereof.

7. The resin composition of claim 6, further comprising (C) a crosslinking agent which comprises an epoxy resin, a polyphenylene oxide resin, a cyanate ester resin, a small molecule vinyl compound, a maleimide resin, a phenolic resin, a benzoxazine resin, a styrene maleic anhydride, a polyolefin resin, a polyester resin, an amine curing agent, a polyamide resin, a polyimide resin or a combination thereof.

8. The resin composition of claim 7, wherein a weight ratio of the component (A) and the component (C) is between 6:1 and 1:6.

9. The resin composition of claim 7, comprising 100 parts by weight of the component (A) and 5 to 200 parts by weight of the component (C).

10. An article made from the resin composition of claim 6, comprising a prepreg, a resin film, a resin film with copper foil, a laminate or a printed circuit board.

11. The article of claim 10, having a dielectric constant at 10 GHz as measured by reference to JIS C2565 of less than or equal to 3.2.

12. The article of claim 10, having a dissipation factor at 10 GHz as measured by reference to JIS C2565 of less than or equal to 0.0030.

13. The article of claim 10, having a glass transition temperature as measured by reference to IPC-TM-650 2.4.24.5 of greater than or equal to 150° C.

14. The article of claim 10, having an interlayer bonding strength as measured by reference to IPC-TM-650 2.4.8 of greater than or equal to 3.70 lb/in.

15. The article of claim 10, having at least one of the following properties:
- a resin flow as measured by reference to IPC-TM-650 2.3.17 of between 15% and 30%;
- a flame retardancy as measured by reference to UL94 standard of V0 or V1;
- a T288 thermal resistance as measured by reference to IPC-TM-650 2.4.24.1 of greater than or equal to 70 minutes;
- a soldering resistance as measured by reference to IPC-TM-650 2.4.23 of greater than or equal to 20 times; and
- a PCT thermal resistance as measured by reference to IPC-TM-650 2.6.16.1 of greater than or equal to 3 hours.

* * * * *